US008736147B1

(12) United States Patent
Wang

(10) Patent No.: US 8,736,147 B1
(45) Date of Patent: May 27, 2014

(54) SOUND AND VIBRATION HARNESSING ENERGY GENERATOR

(75) Inventor: Daniel Wang, Leesburg, VA (US)

(73) Assignee: Daniel Wang, Leesburg, VA (US)

( * ) Notice: Subject to any disclaimer, the term of this patent is extended or adjusted under 35 U.S.C. 154(b) by 352 days.

(21) Appl. No.: 13/220,647

(22) Filed: Aug. 29, 2011

Related U.S. Application Data

(60) Provisional application No. 61/377,960, filed on Aug. 29, 2010.

(51) Int. Cl.
*H01L 41/113* (2006.01)

(52) U.S. Cl.
USPC .......................................... 310/339

(58) Field of Classification Search
USPC .......................................... 310/339
See application file for complete search history.

(56) References Cited

U.S. PATENT DOCUMENTS

| | | | | |
|---|---|---|---|---|
| 8,198,789 | B2* | 6/2012 | Choi et al. | 310/339 |
| 2001/0006286 | A1* | 7/2001 | Lorenz et al. | 280/728.3 |
| 2005/0000629 | A1* | 1/2005 | Bhardwaj | 156/182 |
| 2005/0110277 | A1* | 5/2005 | Adamson et al. | 290/1 R |
| 2011/0050042 | A1* | 3/2011 | Choi et al. | 310/339 |
| 2011/0163636 | A1* | 7/2011 | Sirbuly et al. | 310/339 |
| 2011/0204317 | A1* | 8/2011 | Park et al. | 257/9 |
| 2012/0235541 | A1* | 9/2012 | Pinkerton | 310/339 |

* cited by examiner

*Primary Examiner* — Thomas Dougherty

(57) ABSTRACT

One embodiment of a piezoelectric generator which uses fibrous piezoelectric sensors to harness energy from sound and vibrations. These sensors will be fitted into a multilayered base consisting of a sound reflecting layer and alternating layers of conductive and nonconductive materials. The sound reflecting layer will serve to increase energy generation efficiency when multiple sheets of the apparatus is used, and the alternating layers of conductive and nonconductive materials will collect electricity generated from the piezoelectric sensors. Once collected, this electricity will then be used to power appliances or be stored in a battery for future use. Other embodiments are described and shown.

4 Claims, 4 Drawing Sheets

SOUND AND VIBRATION HARNESSING ENERGY GENERATOR

CROSS-REFERENCE TO RELATED APPLICATIONS

Figure 1:
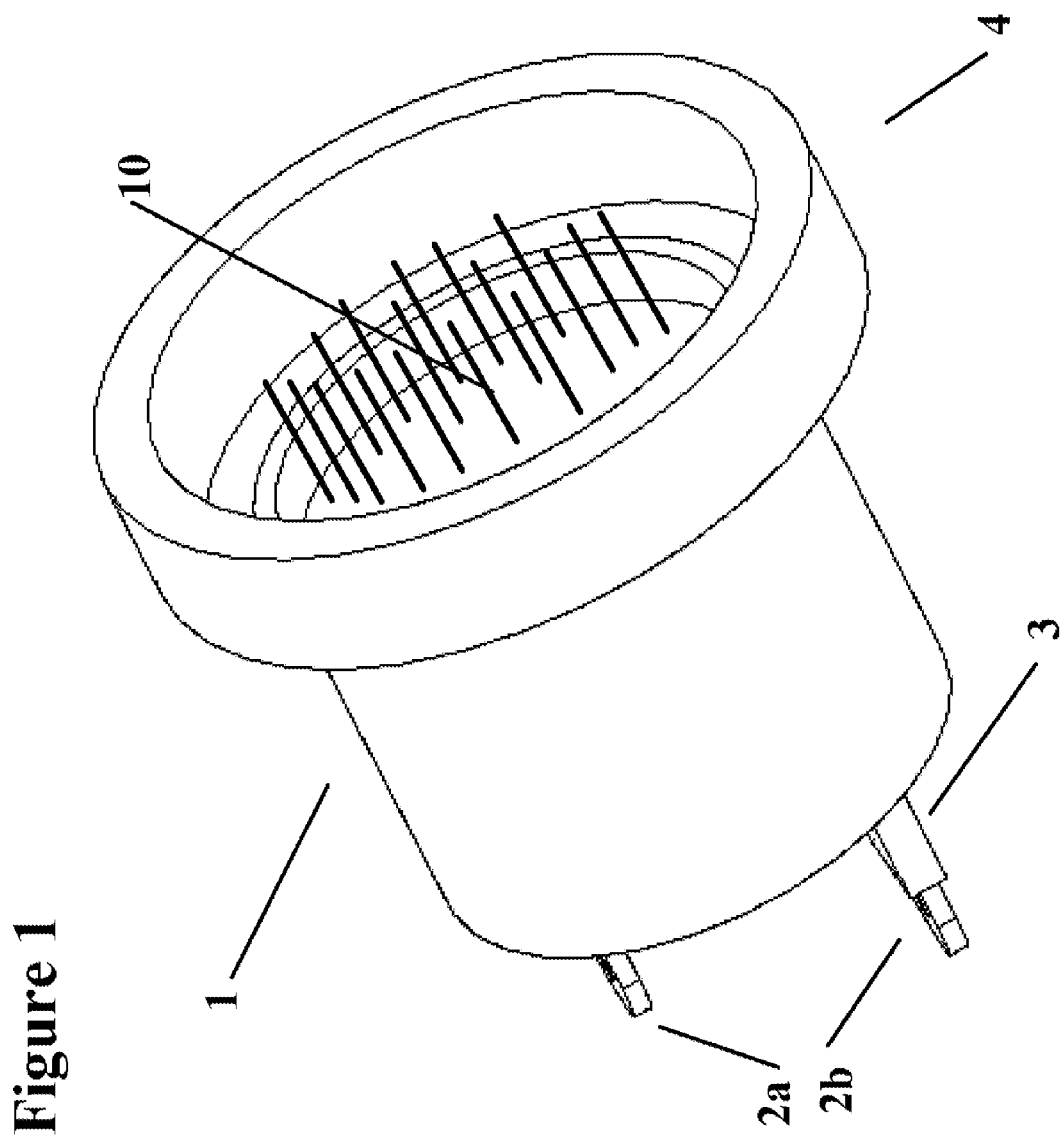

This application claims the benefit of provisional patent application No. 61/377,960 filed 2010 Aug. 29 by the present inventor.

BACKGROUND

Prior Art

The following is a tabulation of some prior art that presently appears relevant:

| U.S. Pat. | | | |
|---|---|---|---|
| Pat. No. | Kind Code | Issue Date | Patentee |
| 0244629 | A1 | Sep. 30, 2010 | Nagashima et al. |
| 5578889 | A1 | Nov. 26, 1996 | Epstein |
| 0050196 | A1 | Jul. 8, 2003 | Okada et al. |

As of now, we are faced with an eminent problem. As technological advancements continue, the current energy capabilities derived from fossil fuels and renewable energy sources are not sufficient to sustain the energy demands of a growing population.

Energy must be developed from resources that allow for easy access on a daily basis, which is why novel ways to capture renewable energy are continuously being proposed and developed. One such technology is piezoelectricity, which utilizes the ability of certain crystalline materials to create electric potentials as a response to mechanical stresses. Forces such as tension or compression can then produce voltages of opposite polarity as the crystals exposed are shortened or lengthened.

Various prior utilizations of piezoelectric materials in producing energy have come from large physical compressions such as movement on floors in U.S. Pat. No. 0,244,629, and through the turbulence of waves in U.S. Pat. No. 5,578,889. However, such applications of piezoelectric material are limited by the type of force being exerted on them. Only larger and more pronounced stressors could be converted to electricity.

In U.S. Pat. No. 0,050,196 (2003), Okada et al. designed a sound absorbing material containing piezoelectric properties which could potentially turn sound into another form of energy. However, Okada et al.'s material was mainly designed to increase sound absorption, and thus converted sounds into heat energy.

SUMMARY

Though energy generation from the piezoelectric effect is still an emerging field, the piezoelectric effect can be used to generate electrical energy not only from large physical decompressions but also from smaller vibrations associated with loud sounds.

As such, in accordance with one embodiment, this apparatus will convert sound into electricity by capturing the changes in pressure and vibrations caused by sound waves onto small fibers. These fibers will be located on small sensors featuring piezoelectric material embedded in a multi-layer flat panel. Each panel will feature an array of such sensors and can be used free standing or applied to hard surfaces such as walls, floors, ceilings, etc. These panels will then harness the energy captured by the fibers and convert that into electricity.

ADVANTAGES

Accordingly, several advantages of one or more aspects are as follows: to provide a new and continuous renewable energy source that draws from piezoelectric technology while not requiring people to be active and mobile to harness the energy. Due to the ubiquitous nature of sound, there will be a continuous source for the embodiment to draw from. In addition, many other stressors such as vibrations such as from steps can also be converted to electrical energy. Other advantages of one or more aspects will be apparent from a consideration of the drawings and ensuing description.

DRAWINGS

Figures

FIG. 1 demonstrates a possible embodiment of a typical piezoelectric sensor (7) which will be used in this apparatus. The sensor will typically consist of three parts, the side (4) which serves to retain and harness sounds covered in fibers made out of piezoelectric material (10), the middle portion where additional piezoelectric crystals (or similar material) is stored (1), and the other end where the electricity will be transferred (2),(3).

Figure 2:
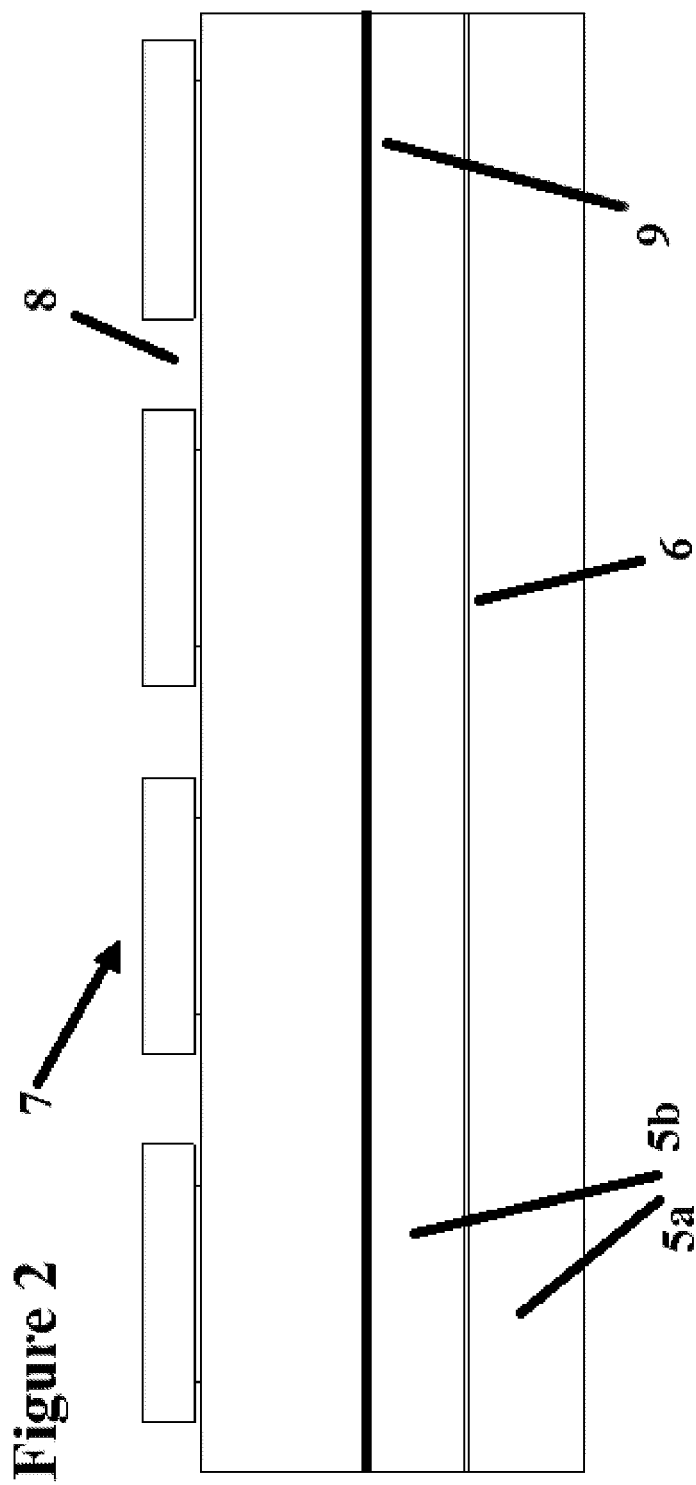

FIG. 2 shows a perspective view of one version of the Sound and Vibration Harnessing Energy Generator, otherwise known as the Sound-Paper if it were lying flat on a surface. As seen, the Sound-Paper will comprise of a few main layers: two thin copper plates (5) separated by a layer of insulation (6), an additional layer of insulation (9), and an outer layer of a sound reflective material (8). These layers will be attached through the use of an adhesive. In one embodiment, the outermost layer of the Sound-Paper (8) will typically be a type of laminated glass, similar to those found in car windshields. However, this layer (8) can also consist of any other material that demonstrates high sound reflection characteristics, (i.e aluminum) and will be 0.4" thick. Directly following this layer will be a thing film of rubber insulation 0.1" thick (9) separating the sound reflectance material (8) from the first copper plate (5b). This copper plate (5b) will be 0.15" thick and followed by another thin film of rubber insulation 0.1" thick (6) and a final copper plate also 0.15" thick (5a).

Figure 3:
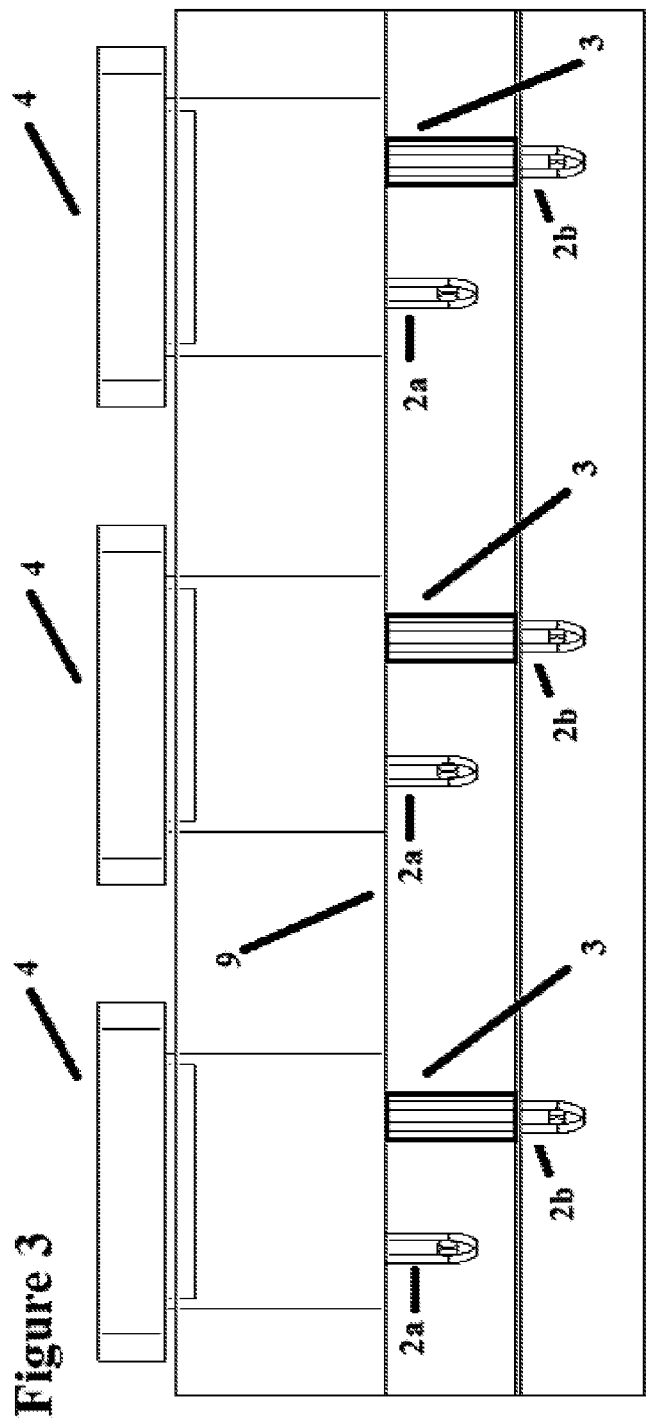

FIG. 3 shows one possible view of a vertical cross section of the apparatus. After the sensor (7) has been embedded into the layers, the top portion of the sensor (4) will extrude out from the outermost sound reflectance layer (8) by 0.1" while the middle portion of the sensor (1) will be 0.5" long and protrude down from the sound reflectance layer (8) to the first rubber insulation layer (9). One of the prongs (2a) at the rear of the sensor will extend 0.05" into the first layer of copper plating (5b), while the other prong (2b) will extend 0.3" into the second copper plate (5a). The longer prong (2b) will also have a rubber protective covering 0.2" long (3) to insulate the prong (2b) from the first copper plate (5b).

Figure 4:
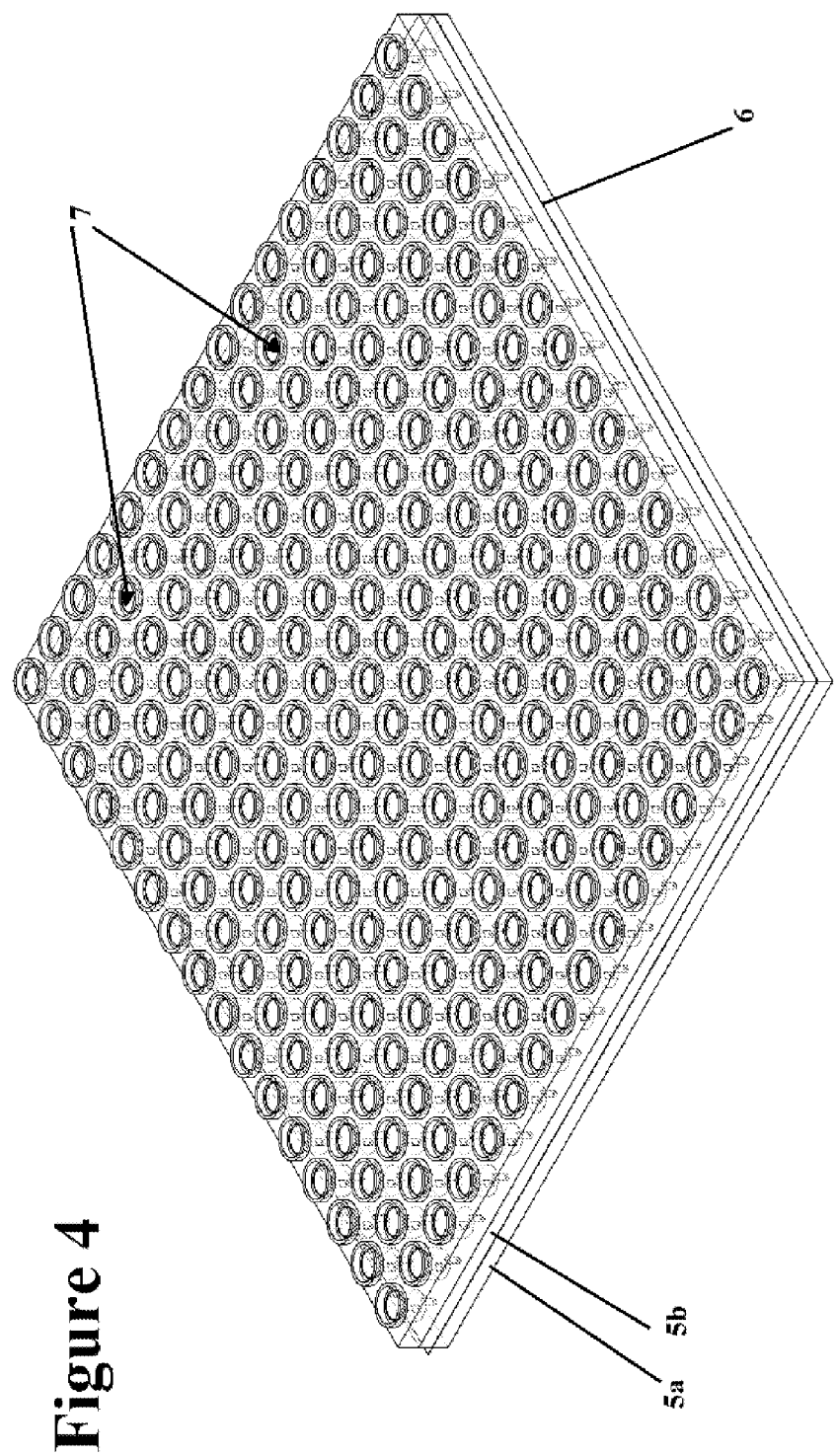

FIG. 4 shows an overall view of the apparatus of the first embodiment. The sensors (7), roughly 1" in diameter, are embedded linearly in both a vertical and horizontal fashion into the layers and are spaced 0.35" apart from each other.

OPERATION

Figures

In operation, the Sound-Paper can be easily applied onto the surfaces of a room, usually the four walls, ceiling, and floor of the room, and will then continuously be able to harness any sound or vibration inside the room into usable energy. When a sound is emitted from inside the room, six effects will convert the sound into electricity which can then be stored and used for other electrical appliances:

(1) The sensors (7), one of which is depicted in FIG. 1, will be stimulated by sound and the fibers on the sensor (10) will harness this sound into electric voltage, due to the piezoelectric effect which allows certain materials to produce an electric charge or field when a mechanical stress is applied.

(2) The electricity generated from the piezoelectric sensors (7) will then be transferred via the two prongs (2a), (2b) behind the sensor to the two copper plates (5) located behind the sensors. Please note that these two plates (5a), (5b), used to collect the electric voltage created from the surrounding noise, are differentiated by the fact that one plate (5a) will collect the positive charges and the other (5b) will collect the negative charges. This is also why the two prongs (2a), (2b) protruding behind the piezoelectric sensors have different lengths.

(3) The different lengths of the prongs and the insulation (3) at the base of one of the prongs serve to make sure that the positive and negative charges will not come into contact with each other. The two copper plates (5) will also be separated by a thin insulating material 6 in order to separate the two charges.

(4) Meanwhile, the layer of highly sound reflective material (8) that the sensors (7) are embedded into will act to enhance the efficiency of the apparatus by reflecting the sound that is not completely captured by the sensors to the other piezoelectric sensors on opposing walls, so that no sound is wasted and energy output is increased.

(5) The two copper plates (5) and the thin layer of insulation material between them (6) will act as a giant capacitor with the insulation material being the dielectric to temporarily store the electrical charge generated by the sensors (7).

(6) Once the electrical charge collected by the capacitor reaches a certain level, then the capacitor will discharge that electricity into a third party battery for storage and future use.

Whenever the user wishes to utilize the electricity generated from this apparatus, all that is required is for the user to do is to extract some of the electrical charges stored in the battery and use it for their own purposes.

CONCLUSIONS, RAMIFICATION, SCOPE

Thus the reader will see that at least one embodiment of the apparatus will allow electricity to be harnessed from various types of physical compressions of piezoelectric material including vibrations, sounds, and external forces. The piezoelectric nature of the apparatus would thus allow for many potential sources of energy to be harnessed, as opposed to the constrained nature of many current renewable energy devices. In addition, the lightweight and versatile nature of the apparatus will allow it to be easily installed indoors (on walls, ceilings, floors, etc.) or mounted at different locations outdoors in order to increase efficiency.

Although the descriptions above contain many specificities, these should not be construed as limiting the scope of the embodiments but as merely providing illustrations of some of several embodiments. For example, the dimensions of the various parts can have other predetermined sizes, and the specific material or shape of the different parts can also be different from the above description, etc.

Thus the scope of the embodiments should be determined by the appended claims and their legal equivalents, rather than by the example given.

The invention claimed is:
1. A energy generator, comprising:
   a. a piezoelectric element to convert sound-waves and other vibrations into electricity
   b. a layer of sound reflecting material
   c. a plurality of both conductive and nonconductive sheets, and
   d. means for joining said sheets together in alternating fashion to the layer of sound reflecting material and means for attaching the piezoelectric elements to the sheets so as to ensure said parts of the generator fit together.

2. The energy generator according to claim 1 wherein said piezoelectric element includes a piezoelectric fiber material attached to the sound reflective layer and the conductive sheets with two protruding apparatuses which serve as a means of transferring energy between said piezoelectric material and said conductive sheets.

3. The energy generator according to claim 1 wherein said conductive and nonconductive sheets are layered in an alternate fashion so that the conductive sheets are prevented from contact.

4. The energy generator according to claim 2 wherein said protruding apparatuses to be of variable length and partially insulated as a method to ensure the separation of electrical charges.

* * * * *